(12) United States Patent
Xia et al.

(10) Patent No.: US 8,689,062 B2
(45) Date of Patent: Apr. 1, 2014

(54) SYSTEMS AND METHODS FOR PARAMETER SELECTION USING RELIABILITY INFORMATION

(75) Inventors: Haitao Xia, San Jose, CA (US);
Shaohua Yang, Santa Clara, CA (US);
Kenneth M. Hall, Santa Cruz, CA (US);
Mark A. Landreth, San Ramon, CA (US)

(73) Assignee: LSI Corporation, San Jose, CA (US)

( * ) Notice: Subject to any disclaimer, the term of this patent is extended or adjusted under 35 U.S.C. 154(b) by 350 days.

(21) Appl. No.: 13/251,342

(22) Filed: Oct. 3, 2011

(65) Prior Publication Data
US 2013/0086439 A1 Apr. 4, 2013

(51) Int. Cl.
*G06F 11/00* (2006.01)

(52) U.S. Cl.
USPC .......................................... 714/708; 714/769

(58) Field of Classification Search
USPC ........ 360/77.06; 375/316; 714/780, 752, 704, 714/705, 770, 708, 769
See application file for complete search history.

(56) References Cited

U.S. PATENT DOCUMENTS

| | | |
|---|---|---|
| 5,278,703 A | 1/1994 | Rub |
| 5,278,846 A | 1/1994 | Okayama et al. |
| 5,317,472 A | 5/1994 | Schweitzer, III |
| 5,325,402 A | 6/1994 | Ushirokawa |
| 5,392,299 A | 2/1995 | Rhines et al. |
| 5,471,500 A | 11/1995 | Blaker et al. |
| 5,513,192 A | 4/1996 | Janku et al. |
| 5,523,903 A | 6/1996 | Hetzler et al. |
| 5,550,870 A | 8/1996 | Blaker et al. |
| 5,612,964 A | 3/1997 | Haraszti |
| 5,701,314 A | 12/1997 | Armstrong et al. |
| 5,710,784 A | 1/1998 | Kindred et al. |
| 5,712,861 A | 1/1998 | Inoue et al. |
| 5,717,706 A | 2/1998 | Ikeda |
| 5,768,044 A | 6/1998 | Hetzler |
| 5,802,118 A | 9/1998 | Bliss et al. |
| 5,844,945 A | 12/1998 | Nam et al. |
| 5,898,710 A | 4/1999 | Amrany |
| 5,923,713 A | 7/1999 | Hatakeyama |
| 5,978,414 A | 11/1999 | Nara |

(Continued)

FOREIGN PATENT DOCUMENTS

| | | |
|---|---|---|
| EP | 0522578 | 1/1993 |
| EP | 0631277 | 12/1994 |

(Continued)

OTHER PUBLICATIONS

U.S. Appl. No. 11/461,026, filed Jul. 31, 2006, Tan, Weijun.

(Continued)

*Primary Examiner* — David Ton
(74) *Attorney, Agent, or Firm* — Hamilton DeSanctis & Cha (57) ABSTRACT

Various embodiments of the present invention provide systems and methods for data processing. For example, a data processing system is disclosed that includes: a data detector circuit, and a reliability monitor circuit. The data detector circuit is operable to apply a data detection algorithm to a data set to yield a detected output that includes soft data. The reliability monitor circuit is operable to determine a proxy error count based at least in part on the soft data, and to modify a parameter governing an operation of the data processing system based at least in part on the proxy error count.

22 Claims, 6 Drawing Sheets

(56) References Cited

U.S. PATENT DOCUMENTS

| | | | |
|---|---|---|---|
| 5,983,383 | A | 11/1999 | Wolf |
| 6,005,897 | A | 12/1999 | McCallister et al. |
| 6,023,783 | A | 2/2000 | Divsalar et al. |
| 6,029,264 | A | 2/2000 | Kobayashi et al. |
| 6,041,432 | A | 3/2000 | Ikeda |
| 6,065,149 | A | 5/2000 | Yamanaka |
| 6,097,764 | A | 8/2000 | McCallister et al. |
| 6,145,110 | A | 11/2000 | Khayrallah |
| 6,216,249 | B1 | 4/2001 | Bliss et al. |
| 6,216,251 | B1 | 4/2001 | McGinn |
| 6,229,467 | B1 | 5/2001 | Eklund et al. |
| 6,266,795 | B1 | 7/2001 | Wei |
| 6,317,472 | B1 | 11/2001 | Choi et al. |
| 6,351,832 | B1 | 2/2002 | Wei |
| 6,377,610 | B1 | 4/2002 | Hagenauer et al. |
| 6,381,726 | B1 | 4/2002 | Weng |
| 6,438,717 | B1 | 8/2002 | Butler et al. |
| 6,473,878 | B1 | 10/2002 | Wei |
| 6,476,989 | B1 | 11/2002 | Chainer et al. |
| 6,594,103 | B1 * | 7/2003 | Despain et al. ............ 360/77.06 |
| 6,625,775 | B1 | 9/2003 | Kim |
| 6,657,803 | B1 | 12/2003 | Ling et al. |
| 6,671,404 | B1 | 12/2003 | Kawatani et al. |
| 6,748,034 | B2 | 6/2004 | Hattori et al. |
| 6,757,862 | B1 | 6/2004 | Marianetti |
| 6,785,863 | B2 | 8/2004 | Blankenship et al. |
| 6,788,654 | B1 | 9/2004 | Hashimoto et al. |
| 6,810,502 | B2 | 10/2004 | Eidson et al. |
| 6,980,382 | B2 | 12/2005 | Hirano et al. |
| 6,986,098 | B2 | 1/2006 | Poeppelman et al. |
| 7,010,051 | B2 | 3/2006 | Murayama et al. |
| 7,047,474 | B2 | 5/2006 | Rhee et al. |
| 7,058,873 | B2 | 6/2006 | Song et al. |
| 7,073,118 | B2 | 7/2006 | Greeberg et al. |
| 7,093,179 | B2 | 8/2006 | Shea |
| 7,113,356 | B1 | 9/2006 | Wu |
| 7,136,244 | B1 | 11/2006 | Rothbert |
| 7,173,783 | B1 | 2/2007 | McEwen et al. |
| 7,184,486 | B1 | 2/2007 | Wu et al. |
| 7,191,378 | B2 | 3/2007 | Eroz et al. |
| 7,203,015 | B2 | 4/2007 | Sakai et al. |
| 7,203,887 | B2 | 4/2007 | Eroz et al. |
| 7,236,757 | B2 | 6/2007 | Raghaven et al. |
| 7,257,764 | B2 | 8/2007 | Suzuki et al. |
| 7,310,768 | B2 | 12/2007 | Eidson et al. |
| 7,313,750 | B1 | 12/2007 | Feng et al. |
| 7,370,258 | B2 | 5/2008 | Iancu et al. |
| 7,403,752 | B2 | 7/2008 | Raghaven et al. |
| 7,430,256 | B2 | 9/2008 | Zhidkov |
| 7,502,189 | B2 | 3/2009 | Sawaguchi et al. |
| 7,505,537 | B1 | 3/2009 | Sutardja |
| 7,523,375 | B2 | 4/2009 | Spencer |
| 7,587,657 | B2 | 9/2009 | Haratsch |
| 7,589,372 | B2 | 9/2009 | Shin et al. |
| 7,590,168 | B2 | 9/2009 | Raghavan et al. |
| 7,702,989 | B2 | 4/2010 | Graef et al. |
| 7,712,008 | B2 | 5/2010 | Song et al. |
| 7,730,384 | B2 * | 6/2010 | Graef et al. .................. 714/780 |
| 7,738,201 | B2 | 6/2010 | Jin et al. |
| 7,752,523 | B1 | 7/2010 | Chaichanavong et al. |
| 7,801,200 | B2 | 9/2010 | Tan |
| 7,802,163 | B2 | 9/2010 | Tan |
| 2003/0063405 | A1 | 4/2003 | Jin et al. |
| 2003/0081693 | A1 | 5/2003 | Raghaven et al. |
| 2003/0087634 | A1 | 5/2003 | Raghaven et al. |
| 2003/0112896 | A1 | 6/2003 | Raghaven et al. |
| 2003/0134607 | A1 | 7/2003 | Raghaven et al. |
| 2004/0071206 | A1 | 4/2004 | Takatsu |
| 2004/0098659 | A1 | 5/2004 | Bjerke et al. |
| 2005/0010855 | A1 | 1/2005 | Lusky |
| 2005/0078399 | A1 | 4/2005 | Fung |
| 2005/0111540 | A1 | 5/2005 | Modrie et al. |
| 2005/0157780 | A1 | 7/2005 | Werner et al. |
| 2005/0195749 | A1 | 9/2005 | Elmasry et al. |
| 2005/0216819 | A1 | 9/2005 | Chugg et al. |
| 2005/0273688 | A1 | 12/2005 | Argon |
| 2006/0020872 | A1 | 1/2006 | Richardson et al. |
| 2006/0031737 | A1 | 2/2006 | Chugg et al. |
| 2006/0123285 | A1 | 6/2006 | De Araujo et al. |
| 2006/0140311 | A1 | 6/2006 | Ashley et al. |
| 2006/0168493 | A1 | 7/2006 | Song et al. |
| 2006/0195772 | A1 | 8/2006 | Graef et al. |
| 2006/0210002 | A1 | 9/2006 | Yang et al. |
| 2006/0248435 | A1 | 11/2006 | Haratsch |
| 2006/0256670 | A1 | 11/2006 | Park et al. |
| 2007/0011569 | A1 | 1/2007 | Casado et al. |
| 2007/0047121 | A1 | 3/2007 | Eleftheriou et al. |
| 2007/0047635 | A1 | 3/2007 | Stojanovic et al. |
| 2007/0110200 | A1 | 5/2007 | Mergen et al. |
| 2007/0230407 | A1 | 10/2007 | Petrie et al. |
| 2007/0286270 | A1 | 12/2007 | Huang et al. |
| 2008/0049825 | A1 | 2/2008 | Chen et al. |
| 2008/0055122 | A1 | 3/2008 | Tan |
| 2008/0065970 | A1 | 3/2008 | Tan |
| 2008/0069373 | A1 | 3/2008 | Jiang et al. |
| 2008/0168330 | A1 | 7/2008 | Graef et al. |
| 2008/0276156 | A1 | 11/2008 | Gunnam et al. |
| 2008/0301521 | A1 | 12/2008 | Gunnam et al. |
| 2009/0185643 | A1 | 7/2009 | Fitzpatrick et al. |
| 2009/0199071 | A1 | 8/2009 | Graef |
| 2009/0235116 | A1 | 9/2009 | Tan et al. |
| 2009/0235146 | A1 | 9/2009 | Tan et al. |
| 2009/0259915 | A1 | 10/2009 | Livshitz et al. |
| 2009/0268848 | A1 * | 10/2009 | Tan et al. ..................... 375/316 |
| 2009/0273492 | A1 | 11/2009 | Yang et al. |
| 2009/0274247 | A1 | 11/2009 | Galbraith et al. |
| 2009/0287978 | A1 * | 11/2009 | Tune et al. ..................... 714/752 |
| 2010/0002795 | A1 | 1/2010 | Raghaven et al. |
| 2010/0042877 | A1 | 2/2010 | Tan |
| 2010/0042890 | A1 | 2/2010 | Gunam |
| 2010/0050043 | A1 | 2/2010 | Savin |
| 2010/0061492 | A1 | 3/2010 | Noeldner |
| 2010/0070837 | A1 | 3/2010 | Xu et al. |
| 2010/0164764 | A1 | 7/2010 | Nayak |
| 2010/0185914 | A1 | 7/2010 | Tan et al. |
| 2011/0075569 | A1 | 3/2011 | Marrow et al. |
| 2011/0080211 | A1 | 4/2011 | Yang et al. |
| 2011/0167246 | A1 | 7/2011 | Yang et al. |

FOREIGN PATENT DOCUMENTS

| | | |
|---|---|---|
| EP | 1814108 | 8/2007 |
| WO | WO 2006/016751 | 2/2006 |
| WO | WO 2006/134527 | 12/2006 |
| WO | WO 2007/091797 | 8/2007 |
| WO | WO 2010/126482 | 4/2010 |
| WO | WO 2010/101578 | 9/2010 |

OTHER PUBLICATIONS

U.S. Appl. No. 11/461,198, filed Jul. 31, 2006, Tan, Weijun.
U.S. Appl. No. 11/461,283, filed Jul. 31, 2006, Tan, Weijun.
U.S. Appl. No. 12/540,283, filed Aug. 12, 2009, Liu, et al.
U.S. Appl. No. 12/652,201, filed Jan. 5, 2010, Mathew, et al.
U.S. Appl. No. 12/763,050, filed Apr. 19, 2010, Ivkovic, et al.
U.S. Appl. No. 12/792,555, filed Jun. 2, 2010, Liu, et al.
U.S. Appl. No. 12/887,317, filed Sep. 21, 2010, Xia, et al.
U.S. Appl. No. 12/887,330, filed Sep. 21, 2010, Zhang, et al.
U.S. Appl. No. 12/887,369, filed Sep. 21, 2010, Liu, et al.
U.S. Appl. No. 12/901,816, filed Oct. 11, 2010, Li, et al.
U.S. Appl. No. 12/901,742, filed Oct. 11, 2010, Yang.
U.S. Appl. No. 12/917,756, filed Nov. 2, 2010, Miladinovic, et al.
U.S. Appl. No. 12/947,931, filed Nov. 17, 2010, Yang, Shaohua.
U.S. Appl. No. 12/947,947, filed Nov. 17, 2010, Ivkovic, et al.
U.S. Appl. No. 12/972,942, filed Dec. 20, 2010, Liao, et al.
U.S. Appl. No. 12/992,948, filed Nov. 16, 2010, Yang, et al.
U.S. Appl. No. 13/021,814, filed Feb. 7, 2011, Jin, Ming, et al.
U.S. Appl. No. 13/031,818, filed Feb. 22, 2011, Xu, Changyou, et al.
U.S. Appl. No. 13/050,129, filed Mar. 17, 2011, Tan, et al.
U.S. Appl. No. 13/050,765, filed Mar. 17, 2011, Yang, et al.
U.S. Appl. No. 13/088,119, filed Apr. 15, 2011, Zhang, et al.
U.S. Appl. No. 13/088,146, filed Apr. 15, 2011, Li, et al.

(56) References Cited

OTHER PUBLICATIONS

U.S. Appl. No. 13/088,178, filed Apr. 15, 2011, Sun, et al.
U.S. Appl. No. 13/126,748, filed Apr. 28, 2011, Tan.
U.S. Appl. No. 13/167,764, filed Jun. 24, 2011, Li, Zongwang, et al.
U.S. Appl. No. 13/167,771, filed Jun. 24, 2011, Li, Zongwang, et al.
U.S. Appl. No. 13/167,775, filed Jun. 24, 2011, Li, Zongwang.
U.S. Appl. No. 13/186,146, filed Jul. 19, 2011, Mathew, et al.
U.S. Appl. No. 13/186,213, filed Jul. 19, 2011, Mathew, et al.
U.S. Appl. No. 13/186,234, filed Jul. 19, 2011, Xia, Haitao, et al.
U.S. Appl. No. 13/186,251, filed Jul. 19, 2011, Xia, Haitao, et al.
U.S. Appl. No. 13/186,174, filed Jul. 19, 2011, Mathew, et al.
U.S. Appl. No. 13/186,197, filed Jul. 19, 2011, Mathew, George et al.
U.S. Appl. No. 13/213,751, filed Aug. 19, 2011, Zhang, Fan, et al.
U.S. Appl. No. 13/213,808, filed Aug. 19, 2011, Jin, Ming.
U.S. Appl. No. 13/220,142, filed Aug. 29, 2011, Chang, Wu, et al.
U.S. Appl. No. 13/227,538, filed Sep. 8, 2011, Yang, Shaohua, et al.
U.S. Appl. No. 13/227,544, filed Sep. 8, 2011, Yang, Shaohua, et al.
U.S. Appl. No. 13/239,683, filed Sep. 22, 2011, Xu, Changyou.
U.S. Appl. No. 13/239,719, filed Sep. 22, 2011, Xia, Haitao, et al.
U.S. Appl. No. 13/251,342, filed Oct. 2, 2011, Xia, Haitao, et al.
U.S. Appl. No. 13/269,832, filed Oct. 10, 2011, Xia, Haitao, et al.
U.S. Appl. No. 13/269,852, filed Oct. 10, 2011, Xia, Haitao, et al.
U.S. Appl. No. 13/284,819, filed Oct. 28, 2011, Tan, Weijun, et al.
U.S. Appl. No. 13/284,730, filed Oct. 28, 2011, Zhang, Fan, et al.
U.S. Appl. No. 13/284,754, filed Oct. 28, 2011, Zhang, Fan, et al.
U.S. Appl. No. 13/284,767, filed Oct. 28, 2011, Zhang, Fan, et al.
U.S. Appl. No. 13/284,826, filed Oct. 28, 2011, Tan, Weijun, et al.
U.S. Appl. No. 13/295,150, filed Nov. 14, 2011, Li, Zongwang, et al.
U.S. Appl. No. 13/295,160, filed Nov. 14, 2011, Li, Zongwang, et al.
U.S. Appl. No. 13/251,340, filed Oct. 3, 2011, Xia, Haitao, et al.
Amer et al "Design Issues for a Shingled Write Disk System" MSST IEEE 26th Symposium May 2010.
Bahl, et al "Optimal decoding of linear codes for Minimizing symbol error rate", IEEE Trans. Inform. Theory, vol. 20, pp. 284-287, Mar. 1974.
Casado et al., Multiple-rate low-denstiy parity-check codes with constant blocklength, IEEE Transations on communications, Jan. 2009, vol. 57, pp. 75-83.
Collins and Hizlan, "Determinate State Convolutional Codes" IEEE Transactions on Communications, Dec. 1993.
Eleftheriou, E. et al., "Low Density Parity-Check Codes for Digital Subscriber Lines", Proc ICC 2002, pp. 1752-1757.
Fisher, R et al., "Adaptive Thresholding"[online] 2003 [retrieved on May 28, 2010] Retrieved from the Internet <URL:http://homepages.inf.ed.ac.uk/rbf/HIPR2/adpthrsh.htm.
Fossnorier, Marc P.C. "Quasi-Cyclic Low-Density Parity-Check Codes From Circulant Permutation Maricies" IEEE Transactions on Information Theory, vol. 50, No. 8 Aug. 8, 2004.
Gibson et al "Directions for Shingled-Write and Two-Dimensional Magnetic Recording System" Architectures: Synergies with Solid-State Disks Carnegie Mellon Univ. May 1, 2009.
K. Gunnam et al., "Next Generation iterative LDPC solutions for magnetic recording storage", invited paper. The Asilomar Conference on Signals, Systems, and Computers, Nov. 2008.
K. Gunnam et al., "Value-Reuse Properties of Min-Sum for Gf(q)" (dated Oct. 2006) Dept. of ECE, Texas A&M University Technical Note, published about Aug. 2010.
K. Gunnam et al., "Value-Reuse Properties of Min-Sum for Gf(q)"(dated Jul. 2008) Dept. of ECE, Texas A&M University Technical Note, published about Aug. 2010.
K. Gunnam "Area and Energy Efficient VLSI Architectures for Low-Density Parity-Check Decoders Using an On-The-Fly Computation" dissertation at Texas A&M University, Dec. 2006.
Han and Ryan, "Pinning Techniques for Low-Floor Detection/Decoding of LDPC-Coded Partial Response Channels", 5th International Symposium on Turbo Codes &Related Topics, 2008.
Hagenauer, J. et al A Viterbi Algorithm with Soft-Decision Outputs and its Applications in Proc. IEEE Globecom, pp. 47. 11-47 Dallas, TX Nov. 1989.

Lee et al., "Partial Zero-Forcing Adaptive MMSE Receiver for DS-CDMA Uplink in Multicell Environments" IEEE Transactions on Vehicular Tech. vol. 51, No. 5, Sep. 2002.
Lin et al "An efficient VLSI Architecture for non binary LDPC decoders"—IEEE Transaction on Circuits and Systems II vol. 57, Issue 1 (Jan. 2010) pp. 51-55.
Mohsenin et al., "Split Row: A Reduced Complexity, High Throughput LDPC Decoder Architecture", pp. 1-6, printed from www.ece.ucdavis.edu on Jul. 9, 2007.
Moon et al, "Pattern-dependent noise prediction in signal-dependent Noise," IEEE JSAC, vol. 19, No. 4 pp. 730-743, Apr. 2001.
Perisa et al "Frequency Offset Estimation Based on Phase Offsets Between Sample Correlations" Dept. of Info. Tech. University of Ulm 2005.
Sari H et al., "Transmission Techniques for Digital Terrestrial TV Broadcasting" IEEE Communications Magazine, IEEE Service Center NY, NY vol. 33, No. 2 Feb. 1995.
Selvarathinam, A.: "Low Density Parity-Check Decoder Architecture for High Throughput Optical Fiber Channels" IEEE International Conference on Computer Design (ICCD '03) 2003.
Shu Lin, Ryan, "Channel Codes, Classical and Modern" 2009, Cambridge University Press, pp. 213-222.
Unknown, "Auto threshold and Auto Local Threshold" [online] [retrieved May 28, 2010] Retrieved from the Internet: <URL:http://www.dentristy.bham.ac.uk/landinig/software/autoth.
Vasic, B., "High-Rate Low-Density Parity-Check Codes Based on Anti-Pasch Affine Geometries," Proc ICC 2002, pp. 1332-1336.
Vasic, B., "High-Rate Girth-Eight Codes on Rectangular Integer Lattices", IEEE Trans. Communications, vol. 52, Aug. 2004, pp. 1248-1252.
Wang Y et al., "A Soft Decision Decoding Scheme for Wireless COFDM With Application to DVB-T" IEEE Trans. on Consumer elec., IEEE Service Center, NY,NY vo. 50, No. 1 Feb. 2004.
Weon-Cheol Lee et al., "Vitierbi Decoding Method Using Channel State Info. in COFDM System" IEEE Trans. on Consumer Elect., IEEE Service Center, NY, NY vol. 45, No. 3 Aug. 1999.
Xia et al, "A Chase-GMD algorithm of Reed-Solomon codes on perpendicular channels", IEEE Transactions on Magnetics, vol. 42 pp. 2603-2605, Oct. 2006.
Xia et al, "Reliability-based Reed-Solomon decoding for magnetic recording channels", IEEE International Conference on Communication pp. 1977-1981, May 2008.
Yeo et al., "VLSI Architecture for Iterative Decoders in Magnetic Storage Channels", Mar. 2001, pp. 748-755, IEEE trans. Magnetics, vol. 37, No. 2.
Youn, et al. "BER Perform. Due to Irrreg. of Row-Weight Distrib. of the Parity-Chk. Matirx in Irreg. LDPC Codes for 10-Gb/s Opt. Signls" Jrnl of Lightwave Tech., vol. 23, Sep. 2005.
Zhong et al., "Area-Efficient Min-Sum Decoder VLSI Architecture for High-Rate QC-LDPC Codes in Magnetic Recording", pp. 1-15, Submitted 2006, not yet published.
Zhong, "Block-LDPC: A Practical LDPC Coding System Design Approach", IEEE Trans. on Circuits, Regular Papers, vol. 5, No. 4, pp. 766-775, Apr. 2005.
Zhong et al., "Design of VLSI Implementation-Oriented LDPC Codes", IEEE, pp. 670-673, 2003.
Zhong et al., "High-Rate Quasi-Cyclic LDPC Codes for Magnetic Recording Channel with Low Error Floor", ISCAS, IEEE pp. 3546-3549, May 2006.
Zhong et al., "Iterative MAX-LOG-MAP and LDPC Detector/Decoder Hardware Implementation for Magnetic Read Channel", SRC Techron, pp. 1-4, Oct. 2005.
Zhong et al., "Joint Code-Encoder Design for LDPC Coding System VLSI Implementation", ISCAS, IEEE pp. 389-392, May 2004.
Zhong, "VLSI Architecture of LDPC Based Signal Detection and Coding System for Magnetic Recording Channel", Thesis, RPI, Troy, NY, pp. 1-95, May 2006.

\* cited by examiner

SYSTEMS AND METHODS FOR PARAMETER SELECTION USING RELIABILITY INFORMATION

BACKGROUND OF THE INVENTION

The present inventions are related to systems and methods for system characterization, and more particularly to systems and methods for tuning a data processing system.

Various storage systems include data processing circuitry implemented with one or more modifiable variables that may be tuned to improve processing performance. In some cases, known data patterns are provided to the data processing circuitry, and an error rate of the data processing circuitry is monitored while one or more of the modifiable variables are changed. This process is continued until acceptable values for the modifiable variables are identified. Such an approach utilizes storage area for the known pattern thus diminishing the usable storage area, and obtaining a meaningful error rate can take considerable time which increases the costs of manufacturing the storage systems.

Hence, for at least the aforementioned reasons, there exists a need in the art for advanced systems and methods for data processing.

BRIEF SUMMARY OF THE INVENTION

The present inventions are related to systems and methods for system characterization, and more particularly to systems and methods for tuning a data processing system.

Various embodiments of the present invention provide data processing systems that include: a data detector circuit, and a reliability monitor circuit. The data detector circuit is operable to apply a data detection algorithm to a data set to yield a detected output that includes soft data. The reliability monitor circuit is operable to determine a proxy error count based at least in part on the soft data, and to modify a parameter governing an operation of the data processing system based at least in part on the proxy error count. In some cases, the aforementioned embodiments of the present invention are implemented as part of a storage device or a receiving device. In some cases, the aforementioned embodiments of the present invention are implemented as part of an integrated circuit.

In some instances of the aforementioned embodiments, the data detection algorithm is a maximum a posteriori data detection algorithm. In other instances, the data detection algorithm is a Viterbi detection algorithm. In some cases, the data processing system further includes a data decoder circuit operable to apply a data decode algorithm to a derivative of the detected output to yield a decoded output. In some cases, the data decode algorithm is a low density parity check algorithm.

In some cases, the reliability monitor circuit includes: a comparator circuit that is operable to compare instances of the soft data against a threshold value; and a counter circuit that is operable to increment when an instance of the soft data is less than the threshold value to yield the proxy error count. In some such cases, the threshold value is programmable. In various of such cases, the reliability monitor circuit further includes a parameter modification control circuit that is operable to: select a first value for the parameter and to store a first instance of the proxy error count corresponding to the first value; select a second value for the parameter and to store a second instance of the proxy error count corresponding to the first value; and select one of the first value and the second value based at least in part on a comparison of the first instance of the proxy error count and the second instance of the proxy error count. In some particular cases, selecting the second value for the parameter includes: determining a search direction based at least in part on the first value; and using the search value and a step size to calculate the second value. In some cases, the steps size is programmable. In other cases, selecting the first value for the parameter includes selecting one of a number of values to be searched; and selecting the second value for the parameter includes selecting another of the number of values to be searched.

Other embodiments of the present invention provide methods for data processing that include: performing a data detection algorithm using a data detector circuit on a data set to yield a detected output that includes soft data; comparing instances of the soft data against a threshold value; modifying a proxy error count value based at least in part on the comparison of the instances of the soft data against the threshold value; and selecting a parameter value based at least in part on the proxy error count, wherein the parameter value governs an operation of a data processing circuit. In some instances of the aforementioned embodiments, the data set includes a pattern of data that may be a known data pattern, or an unknown data pattern.

In some instances of the aforementioned embodiments, the detected output is a first detected output, the soft data is a first soft data, the parameter value is a first parameter value, wherein the proxy error count is a first proxy error count, the data set is a first data set. In such instances, the methods may further include: performing a data detection algorithm on a second data set to yield a second detected output that includes a second soft data; comparing instances of the second soft data against the threshold value; modifying a second proxy error count value based at least in part on the comparison of the instances of the second soft data against the threshold value; and comparing the first proxy error count with the second proxy error count. In such instances, selecting the first parameter value is based on the comparison of the first proxy error count with the second proxy error count. In some cases, the first parameter value is applied to the data processing circuit while the data detector circuit applies the data detection algorithm to the first data set, and the second parameter value is applied to the data processing circuit while the data detector circuit applies the data detection algorithm to the second data set.

One or more embodiments of the present invention provide data processing systems that include: a data detector circuit; a data decoder circuit, a reliability monitor circuit, and a parameter modification control circuit. The data detector circuit is operable to apply a data detection algorithm to a first data set guided by a decoded output to yield a detected output. The data decoder circuit is operable to apply a data decode algorithm to a second data set to yield the decoded output. The second data set is derived from the first data set. The reliability monitor circuit is operable to calculate an error rate. The error rate may be calculated based at least in part on a third data set derived from the decoded output or the first data set. The parameter modification circuit is operable to: select a first value for a parameter and to store a first instance of the error rate corresponding to the first value; select a second value for the parameter and to store a second instance of error count corresponding to the second value, and select one of the first value and the second value based at least in part on a comparison of the first instance of the error rate and the second instance of the error rate. Selecting the second value includes: determining a search direction based at least in part on the first value; and using the search value and a step size to calculate the second value. In some cases, the steps size is programmable. The embodiments may be implemented in a number of different end devices or systems. For example, the embodiments may be implemented in a storage device or a receiving device. Further, in some cases, the data processing systems may be implemented as part of an integrated circuit.

In some instances of the aforementioned embodiments, calculating the error rate includes comparing the third data set against a known data set. In some such instances, the third data set is a set of hard decision outputs. The data detection algorithm may be, but is not limited to, a maximum a posteriori data detection algorithm or a Viterbi detection algorithm. In some cases, the data decode algorithm is a low density parity check algorithm. In particular cases, the output is the third data set derived from the decoded output. In such cases, the reliability monitor circuit may include: a comparator circuit operable to compare instances of the third data set against a known data set; and a counter circuit operable to increment when an instance of the third data set is not equal to a corresponding instance of the known data set to yield the error rate. In some cases, the output is the first data set that includes soft data. In such cases, the reliability monitor circuit may include: a comparator circuit operable to compare instances of the soft data against a threshold value; and a counter circuit operable to increment when an instance of the soft data is less than the threshold value to yield the error rate. In particular cases, the threshold value is programmable.

Some embodiments of the present invention provide methods for data processing. The methods include: performing a data detection algorithm using a data detector circuit on a first data set to yield a detected output; performing a data decode algorithm using a data decoder circuit on a second data set derived from the first data set to yield a decoded output; calculating an error rate based at least in part on one of a third data set derived from the decoded output, or the first data set; selecting a first value for a parameter and storing a first instance of the error rate corresponding to the first value; selecting a second value for the parameter and storing a second instance of error count corresponding to the second value, and selecting one of the first value and the second value based at least in part on a comparison of the first instance of the error rate and the second instance of the error rate. Selecting the second value includes: determining a search direction based at least in part on the first value; and using the search value and a step size to calculate the second value. In some cases, the third data set is a set of hard decision outputs. In various cases, the steps size is programmable.

In some case, the output is the third data set derived from the decoded output. In some such cases, calculating the error rate includes: comparing instances of the third data set against a known data set; and counting the number of instances of the third data set that are not equal to a corresponding instance of the known data set to yield the error rate. In other cases, the output is the first data set that includes soft data. In some such cases, calculating the error rate includes: comparing instances of the soft data against a threshold value; and counting the number of instances of the soft data that are less than the threshold value to yield the error rate. In particular cases, the threshold value is programmable.

This summary provides only a general outline of some embodiments of the invention. Many other objects, features, advantages and other embodiments of the invention will become more fully apparent from the following detailed description, the appended claims and the accompanying drawings.

BRIEF DESCRIPTION OF THE DRAWINGS

A further understanding of the various embodiments of the present invention may be realized by reference to the figures which are described in remaining portions of the specification. In the figures, like reference numerals are used throughout several figures to refer to similar components. In some instances, a sub-label consisting of a lower case letter is associated with a reference numeral to denote one of multiple similar components. When reference is made to a reference numeral without specification to an existing sub-label, it is intended to refer to all such multiple similar components.

DETAILED DESCRIPTION OF THE INVENTION

The present inventions are related to systems and methods for system characterization, and more particularly to systems and methods for tuning a data processing system.

Various embodiments of the present invention provide systems and methods for tuning and/or testing a data processing circuit using reliability data generated from any available data set. The reliability data may be derived from any available data sets including defined known data sets or unknown user data sets. In some cases, the tuning allows for use of metrics for tuning different channel parameters in such a way that time used to tune the data processing circuit is reduced. One or more embodiments of the present invention provide an advantage of reducing storage area required to maintain known data patterns, and/or allow reduced testing and/or tuning times.

Figure 1:
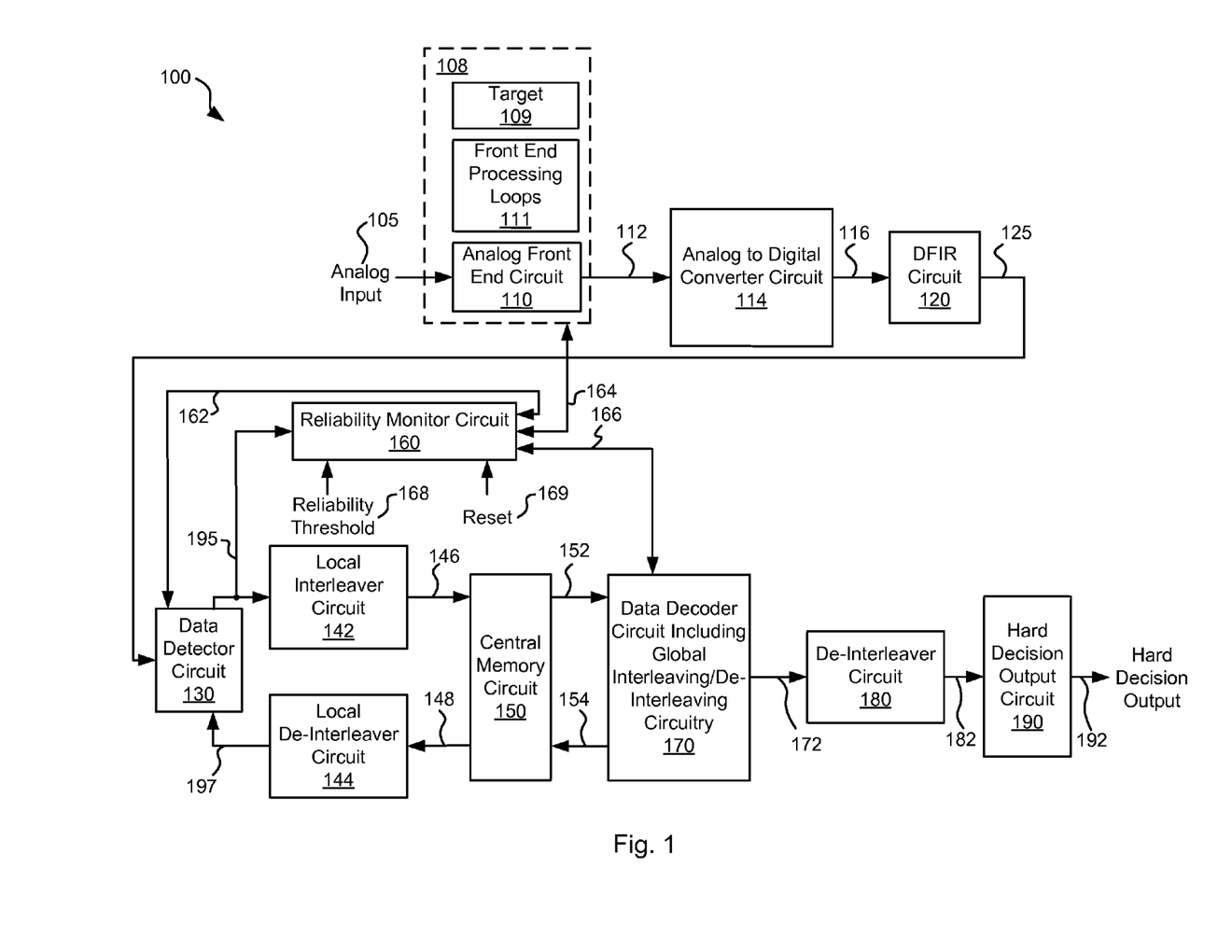
FIG. 1 shows a data processing circuit including reliability data based tuning circuitry in accordance with one or more embodiments of the present invention.

Turning to FIG. 1, a data processing circuit 100 is shown that includes a reliability monitor circuit 160 that is operable to monitor soft data included as part of a detector output 195 and to modify one or more parameters based upon the monitored soft data. Data processing circuit 100 includes an analog processing circuit 108 that includes an analog front end circuit 110, front end processing loops 111 operable to provide timing and control to analog front end circuit 110, and a target circuit 109 operable to provide target based filtering feedback to analog front end circuit 110. Analog front end circuit 110 may include, but is not limited to, an analog filter and an amplifier circuit as are known in the art. Based upon the disclosure provided herein, one of ordinary skill in the art will recognize a variety of circuitry that may be included as part of analog front end circuit 110. In some cases, the gain of a variable gain amplifier included as part of analog front circuit 110 may be modifiable, and the cutoff frequency and boost of an analog filter included in analog front end circuit 110 may be modifiable. Front end processing loops 111 may be any processing loops operable to provide timing for analog front end circuit 110 known in the art. In some cases, such front end processing loops 111 include a DC loop offset that may be modifiable. Target circuit 109 may be any target based filter circuit known in the art. In various cases, a target used by target circuit 109 may be modifiable. Based upon the disclosure provided herein, one of ordinary skill in the art will recognize a variety of target based filter circuits and front end processing loops that may be used in relation to different embodiments of the present invention.

Analog front end circuit 110 that receives an analog signal 105. Analog front end circuit 110 processes analog signal 105 and provides a processed analog signal 112 to an analog to digital converter circuit 114. In some cases, analog signal 105 is derived from a read/write head assembly (not shown) that is disposed in relation to a storage medium (not shown). In other cases, analog signal 105 is derived from a receiver circuit (not shown) that is operable to receive a signal from a transmission medium (not shown). The transmission medium may be wired or wireless. Based upon the disclosure provided herein, one of ordinary skill in the art will recognize a variety of sources from which analog input 105 may be derived.

Analog to digital converter circuit 114 converts processed analog signal 112 into a corresponding series of digital samples 116. Analog to digital converter circuit 114 may be any circuit known in the art that is capable of producing digital samples corresponding to an analog input signal. Based upon the disclosure provided herein, one of ordinary skill in the art will recognize a variety of analog to digital converter circuits that may be used in relation to different embodiments of the present invention. Digital samples 116 are provided to an equalizer circuit 120. Equalizer circuit 120 applies an equalization algorithm to digital samples 116 to yield an equalized output 125. In some embodiments of the present invention, equalizer circuit 120 is a digital finite impulse response filter circuit as are known in the art. Equalized output 125 is provided to a data detector circuit 130. In some cases, equalizer 120 includes sufficient memory to maintain one or more codewords until a data detector circuit 130 is available for processing.

Data detector circuit 130 is operable to apply a data detection algorithm to a received codeword or data set, and in some cases data detector circuit 130 can process two or more codewords in parallel. In some embodiments of the present invention, data detector circuit 130 is a Viterbi algorithm data detector circuit as are known in the art. In other embodiments of the present invention, data detector circuit 130 is a maximum a posteriori data detector circuit as are known in the art. Of note, the general phrases "Viterbi data detection algorithm" or "Viterbi algorithm data detector circuit" are used in their broadest sense to mean any Viterbi detection algorithm or Viterbi algorithm detector circuit or variations thereof including, but not limited to, bi-direction Viterbi detection algorithm or bi-direction Viterbi algorithm detector circuit. Also, the general phrases "maximum a posteriori data detection algorithm" or "maximum a posteriori data detector circuit" are used in their broadest sense to mean any maximum a posteriori detection algorithm or detector circuit or variations thereof including, but not limited to, simplified maximum a posteriori data detection algorithm and a max-log maximum a posteriori data detection algorithm, or corresponding detector circuits. Based upon the disclosure provided herein, one of ordinary skill in the art will recognize a variety of data detector circuits that may be used in relation to different embodiments of the present invention. Data detector circuit 130 is started based upon availability of a data set from equalizer circuit 120 or from a central memory circuit 150.

Upon completion, data detector circuit 130 provides detector output 195. Detector output 195 includes soft data. As used herein, the phrase "soft data" is used in its broadest sense to mean reliability data with each instance of the reliability data indicating a likelihood that a corresponding bit position or group of bit positions has been correctly detected. In some embodiments of the present invention, the soft data or reliability data is log likelihood ratio data as is known in the art. Detected output 195 is provided to a local interleaver circuit 142 and reliability monitor circuit 160. Local interleaver circuit 142 is operable to shuffle sub-portions (i.e., local chunks) of the data set included as detected output and provides an interleaved codeword 146 that is stored to central memory circuit 150. Interleaver circuit 142 may be any circuit known in the art that is capable of shuffling data sets to yield a re-arranged data set. Interleaved codeword 146 is stored to central memory circuit 150.

Once data decoder circuit 170 is available, a previously stored interleaved codeword 146 is accessed from central memory circuit 150 as a decoder input 152, globally interleaved as is known in the art, and a data decode algorithm is applied. In some embodiments of the present invention, the data decode algorithm is a low density parity check algorithm as are known in the art. Based upon the disclosure provided herein, one of ordinary skill in the art will recognize other decode algorithms that may be used in relation to different embodiments of the present invention. As the data decode algorithm completes on a given data set, it is determined whether the decode algorithm converged (i.e., the resulting data set matches the originally written data set as indicated by the lack of parity errors). Where it is determined that the decode algorithm converged, the resulting decoded data set is provided as a hard decision output 172 to a de-interleaver circuit 180. De-interleaver circuit 180 rearranges the data to reverse both the global and local interleaving applied to the data to yield a de-interleaved output 182. De-interleaved output 182 is provided to a hard decision output circuit 190. Hard decision output circuit 190 is operable to re-order data sets that may complete out of order back into their original order. The originally ordered data sets are then provided as a hard decision output 192.

Alternatively, where it is determined that the data decode algorithm failed to converge (i.e., there are remaining parity errors), the completed data set is globally de-interleaved as is known in the art and written back to central memory circuit 150 as a decoder output 154. Once data detector circuit 130 is available, a previously stored decoder output 148 is accessed from central memory circuit 150 and locally de-interleaved by a de-interleaver circuit 144. De-interleaver circuit 144 re-arranges decoder output 148 to reverse the shuffling originally performed by interleaver circuit 142. A resulting de-interleaved output 197 is provided to data detector circuit 130.

In some cases, reliability monitor circuit 160 operates only during a testing/tuning period. In other cases, reliability monitor circuit 160 is continuously operated. Reliability monitor circuit 160 receives detector output 195 and modifies one or more parameter used to govern the operation of data processing circuit 100. The parameters may be communicated to: analog processing circuit 108 via an input/output 164, data detector circuit 130 via an input output 162, and/or to data decoder circuit 170 via an input/output 166. The parameters may be, but are not limited to, a gain of a variable gain amplifier included in analog front end circuit 110, a cutoff frequency and/or boost of an analog filter included in analog front end circuit 110, a DC loop offset of front end processing loops 111, a target used by target circuit 109, a detector parameter used by data detector circuit 130, and/or a decoder parameter used by data decoder circuit 170. Based upon the disclosure provided herein, one of ordinary skill in the art will recognize a variety of parameters that may be adjusted by reliability monitor circuit 160 in accordance with different embodiments of the present invention.

Reliability monitor circuit 160 compares the soft data received as part of detector output 195 and compares it against a reliability threshold 168. In some cases, reliability threshold 168 is user programmable. In other cases, reliability threshold 168 is a fixed value. As data is being processed, reliability monitor circuit 160 selects a value(s) for one or more parameters provided to respective circuits via input/output 162, input/output 164, and input/output 166. Data is then processed through data processing circuit 100 using the selected parameter values over a period of time. Where reliability monitor circuit 160 determines that the soft data from detected output 195 is below reliability threshold 168, an error is indicated. This error is incorporated into an error rate. One or more new values for the one or more parameters are selected and the process of retesting continues at least until reliability monitor circuit 160 determines that the corresponding error rate is acceptable. In some cases, a running average or other accumulation of the soft data is used to compare against reliability threshold 168. In such cases, a reset input 169 may be used to reset the accumulation or running average each time a parameter value is changed by reliability monitor circuit 160. In various cases, reset input 169 is a signal internal to reliability monitor circuit 160.

Figure 2:
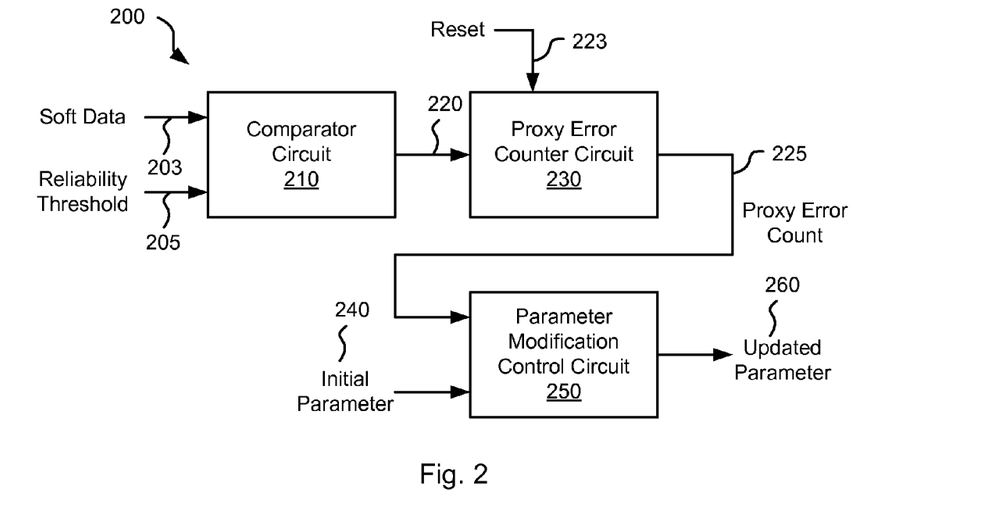
FIG. 2 depicts one implementation of a reliability based tuning circuit in accordance with some embodiments of the present invention.

Turning to FIG. 2, one implementation of a reliability based tuning circuit 200 is shown in accordance with some embodiments of the present invention. Reliability based tuning circuit 200 may be used in place of reliability monitor circuit 160 of data processing circuit 100. Reliability based tuning circuit 200 includes a comparator circuit 210 that is operable to compare soft data 203 that is received as part of a detected output (not shown) against a reliability threshold 205. In some cases, reliability threshold 205 is user programmable. In other cases, reliability threshold 205 is a fixed value. Where an instance of soft data 203 is less than reliability threshold 205, a comparator output 220 is asserted high. In contrast, where an instance of soft data 203 is greater than or equal to reliability threshold 205, comparator output 220 is asserted low. On each clock period (corresponding to the instances of soft data 203) that comparator output 220 is asserted high, a proxy error counter circuit 230 increments. The count from proxy error counter circuit 220 is a proxy error count 225 that is provided to a parameter modification control circuit 250.

Parameter modification control circuit 250 receives an initial parameter value 240 that is initially provided as an updated parameter 260. Updated parameter 260 is provided as a parameter to govern operation of one or more functions within a data processing circuit. As some examples, updated parameter 260 may be, but is not limited to, a gain of a variable gain amplifier, a cutoff frequency and/or boost of an analog filter, a DC loop offset, a target, a detector parameter used by a data detector circuit, and/or a decoder parameter used by a data decoder circuit. Based upon the disclosure provided herein, one of ordinary skill in the art will recognize a variety of parameters that may be adjusted by parameter modification control circuit 250.

In one particular embodiment of the present invention, parameter modification control circuit 250 allows for a defined number of periods of data processing to continue using initial parameter 240 as updated parameter 260. Initial parameter 240 may be a pre-programmed default value. Once the period has completed, proxy error count 225 is stored, and parameter modification circuit 250 selects a new value to be provided as updated parameter 260, and proxy error counter circuit 230 is reset by assertion of a reset signal 223. Data processing is again allowed to run for a defined number of periods using the newly selected value of update parameter 260. This process is completed until all possible values for updated parameter 260 have been tested. In the end, the value for updated parameter 260 that yielded the lowest proxy error count 225 is selected as the tuned parameter for whatever circuit updated parameter 260 was controlling. This process is shown in the following pseudo-code:

```
/* Test Initial Parameter Value
Select Initial Parameter 240 as Updated Parameter 260;
Assert Reset 225;
De-assert Reset 225;
For (i = 0 to end of the Test Period)
{
    If (Soft Data [i] 203 < Reliability Threshold 205)
    {
        Proxy Error Count 225 += 1
    }
}
Parameter Error Count = Proxy Error Count 225;
Parameter Value = Initial Parameter 240;
/* Test All Other Parameter Values */
Assert Reset 225;
De-assert Reset 225;
For (Each Value of Updated Parameter 260)
{
    Select Next Value for Updated Parameter 260;
    For (i = 0 to end of the Test Period)
    {
        If (Soft Data [i] 203 < Reliability Threshold 205)
        {
            Proxy Error Count 225 += 1
        }
    }
    If (Proxy Error Count 225 < Parameter Error Count)
    {
        Parameter Error Count = Proxy Error Count 225;
        Parameter Value = Selected Next Value;
    }
}
Select the Parameter Value.
```

In yet other cases, parameter modification control circuit 250 may be modified to limit the parameter search by limiting the search until proxy error count 225 falls below a defined threshold. Once a parameter value is found that yields a proxy error count 225 below a defined threshold, that parameter value is selected and the parameter search process is completed. In such cases, the defined threshold may be programmable or fixed in value. This process is shown in the following pseudo-code:

```
/* Test Initial Parameter Value
Select Initial Parameter 240 as Updated Parameter 260;
Assert Reset 225;
De-assert Reset 225;
For (i = 0 to end of the Test Period)
{
    If (Soft Data [i] 203 < Reliability Threshold 205)
    {
        Proxy Error Count 225 += 1
    }
}
If (Proxy Error Count < Defined Threshold)
{
    Updated Parameter 260 = Initial Parameter 240;
```

-continued

```
        End Process
    Else
    {
        Parameter Error Count = Proxy Error Count 225;
        Parameter Value = Initial Parameter 240;
    }
    /* Test Other Parameter Values Until Defined Threshold is Achieved*/
    Assert Reset 225;
    De-assert Reset 225;
    For (Each Value of Updated Parameter 260)
    {
        Select Next Value for Updated Parameter 260;
        For (i = 0 to end of the Test Period)
        {
            If (Soft Data [i] 203 < Reliability Threshold 205)
            {
                Proxy Error Count 225 += 1
            }
        }
        If (Proxy Error Count < Defined Threshold)
        {
            Updated Parameter 260 = Selected Next Value;
            End Process
        }
        Else If (Proxy Error Count 225 < Parameter Error Count)
        {
            Parameter Error Count = Proxy Error Count 225;
            Parameter Value = Selected Next Value;
        }
    }
}
```

In yet other cases, a more sophisticated testing process may be used such that all values for updated parameter 260 do not need to be tested. Such a streamlined testing process may be done consistent with that discussed below in relation to FIGS. 5-6 below. In such cases, the operation of parameter modification control circuit 250 may be modified to use the streamlined approach to identifying an acceptable value for updated parameter 260. Of note, the methods discussed below in relation to FIGS. 5-6 may be modified to search through a variety of parameter values based upon an actual error count derived from a known data set. Such an approach is discussed below in relation to FIGS. 8-10.

Figure 3:
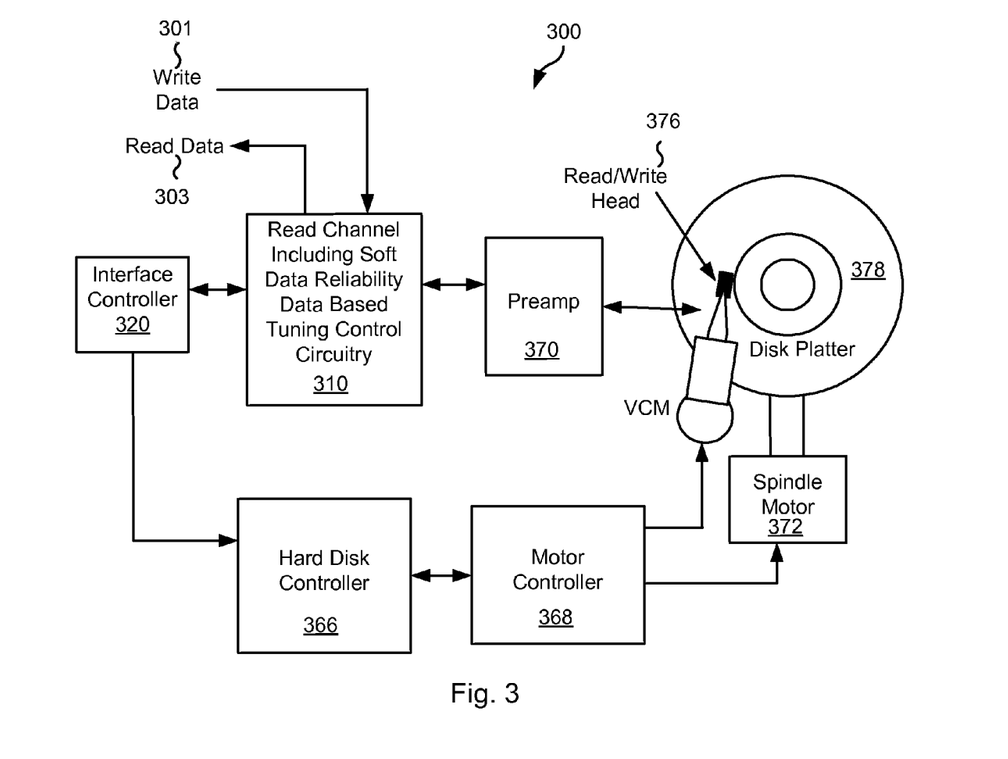
FIG. 3 shows a storage device including a read channel having soft data based tuning circuitry in accordance with one or more embodiments of the present invention.

Turning to FIG. 3, a storage device 300 including a read channel circuit 310 having reliability data based tuning circuitry is shown in accordance with one or more embodiments of the present invention. Storage system 300 may be, for example, a hard disk drive. Storage system 300 also includes a preamplifier 370, an interface controller 320, a hard disk controller 366, a motor controller 368, a spindle motor 372, a disk platter 378, and a read/write head assembly 376. Interface controller 320 controls addressing and timing of data to/from disk platter 378. The data on disk platter 378 consists of groups of magnetic signals that may be detected by read/write head assembly 376 when the assembly is properly positioned over disk platter 378. In one embodiment, disk platter 378 includes magnetic signals recorded in accordance with either a longitudinal or a perpendicular recording scheme.

In a typical read operation, read/write head assembly 376 is accurately positioned by motor controller 368 over a desired data track on disk platter 378. Motor controller 368 both positions read/write head assembly 376 in relation to disk platter 378 and drives spindle motor 372 by moving read/write head assembly to the proper data track on disk platter 378 under the direction of hard disk controller 366. Spindle motor 372 spins disk platter 378 at a determined spin rate (RPMs). Once read/write head assembly 378 is positioned adjacent the proper data track, magnetic signals representing data on disk platter 378 are sensed by read/write head assembly 376 as disk platter 378 is rotated by spindle motor 372. The sensed magnetic signals are provided as a continuous, minute analog signal representative of the magnetic data on disk platter 378. This minute analog signal is transferred from read/write head assembly 376 to read channel circuit 310 via preamplifier 370. Preamplifier 370 is operable to amplify the minute analog signals accessed from disk platter 378. In turn, read channel circuit 310 decodes and digitizes the received analog signal to recreate the information originally written to disk platter 378. This data is provided as read data 303 to a receiving circuit. A write operation is substantially the opposite of the preceding read operation with write data 301 being provided to read channel circuit 310. This data is then encoded and written to disk platter 378.

During a test operation, or in some cases during standard data read operations, the reliability data based tuning control circuitry modifies one or more parameters governing the operation of read channel circuit 310 and continues to monitor whether a reliability threshold is met. In this way, parameters in read channel circuit 310 may be modified to improve the performance of read channel circuit 310. The processing circuit including the reliability data based tuning control circuitry may be implemented similar to that discussed above in relation to FIGS. 1 and 2, and/or may operate similar to that discussed below in relation to FIGS. 5, 6, and/or 7. In other cases, the reliability data based tuning control circuitry may be replaced by known data based tuning control circuitry similar to that discussed below in relation to FIG. 8 that uses a streamlined search similar to that discussed below in relation to FIGS. 5 and 6.

It should be noted that storage system may utilize SATA, SAS or other storage technologies known in the art. Also, it should be noted that storage system 300 may be integrated into a larger storage system such as, for example, a RAID (redundant array of inexpensive disks or redundant array of independent disks) based storage system. It should also be noted that various functions or blocks of storage system 400 may be implemented in either software or firmware, while other functions or blocks are implemented in hardware.

Figure 4:
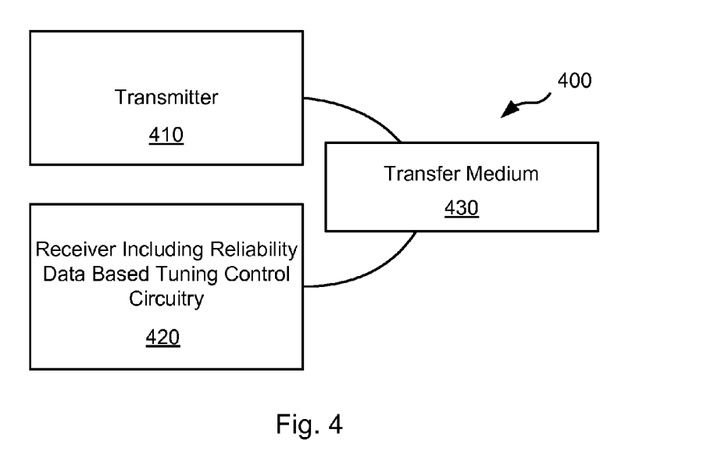
FIG. 4 shows a data transmission system including a receiver having soft data based tuning circuitry in accordance with some embodiments of the present invention.

Turning to FIG. 4, a data transmission system 400 including a receiver 420 having reliability data based tuning circuitry is shown in accordance with some embodiments of the present invention. Data transmission system 400 includes a transmitter 410 that is operable to transmit encoded information via a transfer medium 430 as is known in the art. The encoded data is received from transfer medium 430 by receiver 420. Receiver 420 incorporates reliability data based tuning circuitry. While processing received data, received data is converted from an analog signal to a series of corresponding digital samples, and the digital samples are equalized to yield an equalized output. The equalized output is then provided to a data processing circuit including both a data detector circuit and a data decoder circuit. Data is passed between the data decoder and data detector circuit via a central memory allowing for variation between the number of processing iterations that are applied to different data sets. It should be noted that transfer medium 430 may be any transfer medium known in the art including, but not limited to, a wireless medium, an optical medium, or a wired medium. Based upon the disclosure provided herein, one of ordinary skill in the art will recognize a variety of transfer mediums that may be used in relation to different embodiments of the present invention.

During a test operation, or in some cases during standard data read operations, the reliability data based tuning control circuitry modifies one or more parameters governing the operation of receiver 420 and continues to monitor whether a reliability threshold is met. In this way, parameters in receiver 420 may be modified to improve the performance of receiver 420. The processing circuit including the reliability data based tuning control circuitry may be implemented similar to that discussed above in relation to FIGS. 1 and 2, and/or may operate similar to that discussed below in relation to FIGS. 5, 6, and/or 7. In other cases, the reliability data based tuning control circuitry may be replaced by known data based tuning control circuitry similar to that discussed below in relation to FIG. 8 that uses a streamlined search similar to that discussed below in relation to FIGS. 5 and 6.

Figure 5:
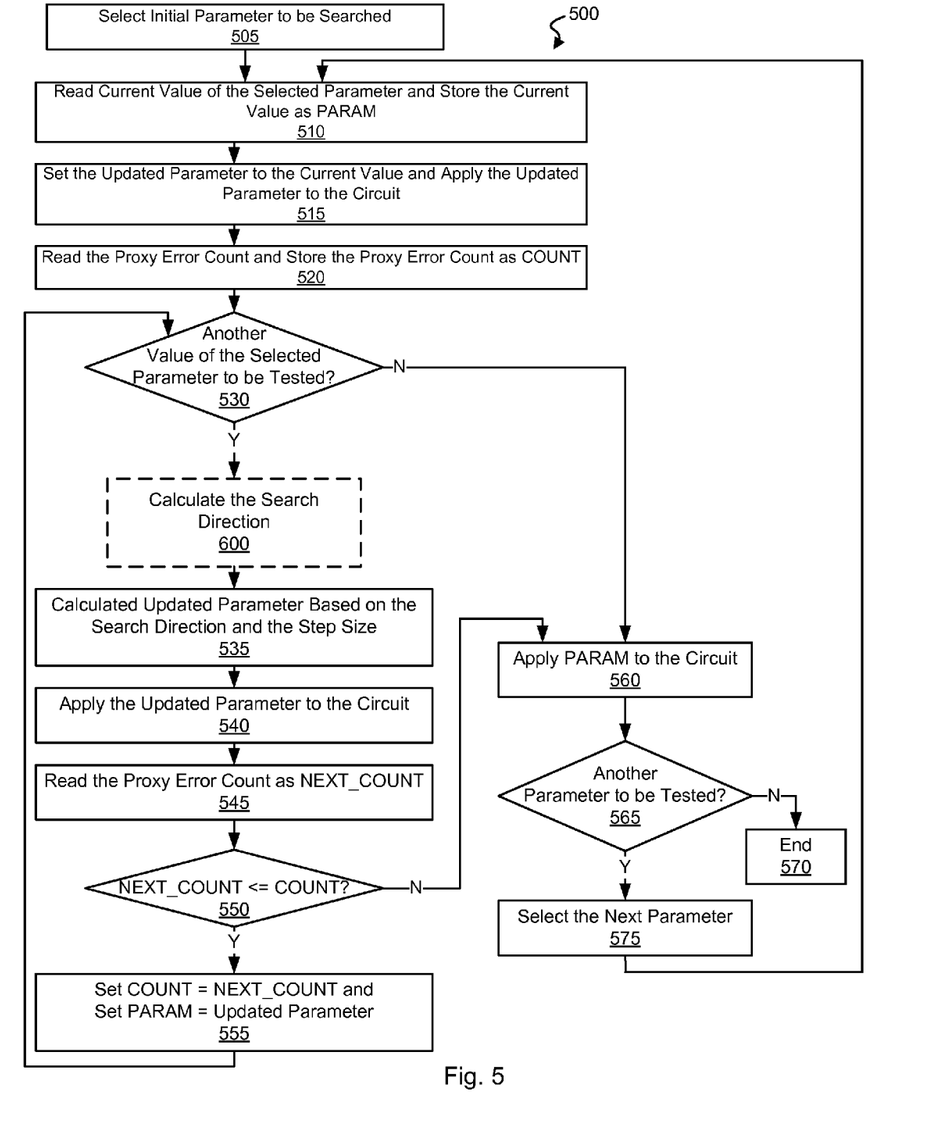
FIGS. 5-6 are flow diagrams showing method for reliability based parameter tuning in accordance with various embodiments of the present invention.

Turning FIG. 5, a flow diagram 500 shows a method for reliability based parameter tuning in accordance with various embodiments of the present invention. Following flow diagram 500, an initial parameter is selected for search (block 505). The selected parameter may be any parameter governing operation of some part of a data processing circuit. As some examples, the parameter may be, but is not limited to, a gain of a variable gain amplifier, a cutoff frequency and/or boost of an analog filter, a DC loop offset, a target, a detector parameter used by a data detector circuit, and/or a decoder parameter used by a data decoder circuit. Based upon the disclosure provided herein, one of ordinary skill in the art will recognize a variety of parameters that may be adjusted by the methods of FIG. 5. A current value of the selected parameter is read and stored as a variable PARAM (block 510). An updated parameter (i.e., a parameter to be applied to the data processing circuit) is set equal to the current value and the updated parameter is applied to the data processing circuit (block 515). Applying the updated parameter to the processing circuit includes operating the processing circuit for a period with the updated parameter. As this processing is done, a count is made of how many instances of soft data from a data detector circuit is less than a defined threshold to yield a proxy error count. Once the processing is done, the proxy error count is read and stored as a variable COUNT (block 520). The proxy error count value is then reset.

It is then determined whether another value of the selected parameter remains to be tested (block 530). Where another value remains to be tested (block 530), a search direction is calculated (block 600). This process of selecting the search direction is discussed below in more detail in relation to FIG. 6. Once the search direction is identified (block 600), a value for the updated parameter is calculated based on the search direction and a step size (block 535). In some cases, the step size may be user programmable, while in other cases the step size may be fixed. In some embodiments of the present invention, the value of the updated parameter is calculated in accordance with the following pseudo-code:

```
If (Search Direction is Positive)
{
    Updated Parameter = Updated Parameter + Step Size
}
Else
{
    Updated Parameter = Updated Parameter - Step Size
}
```

This newly updated parameter is then applied to the data processing circuit (block 540). Applying the updated parameter to the processing circuit includes operating the processing circuit for a period with the updated parameter. As this processing is done, a count is made of how many instances of soft data from a data detector circuit is less than a defined threshold to yield a proxy error count. Once the processing is done, the proxy error count is read and stored as a variable NEXT_COUNT (block 545). The proxy error count value is then reset.

Figure 6:
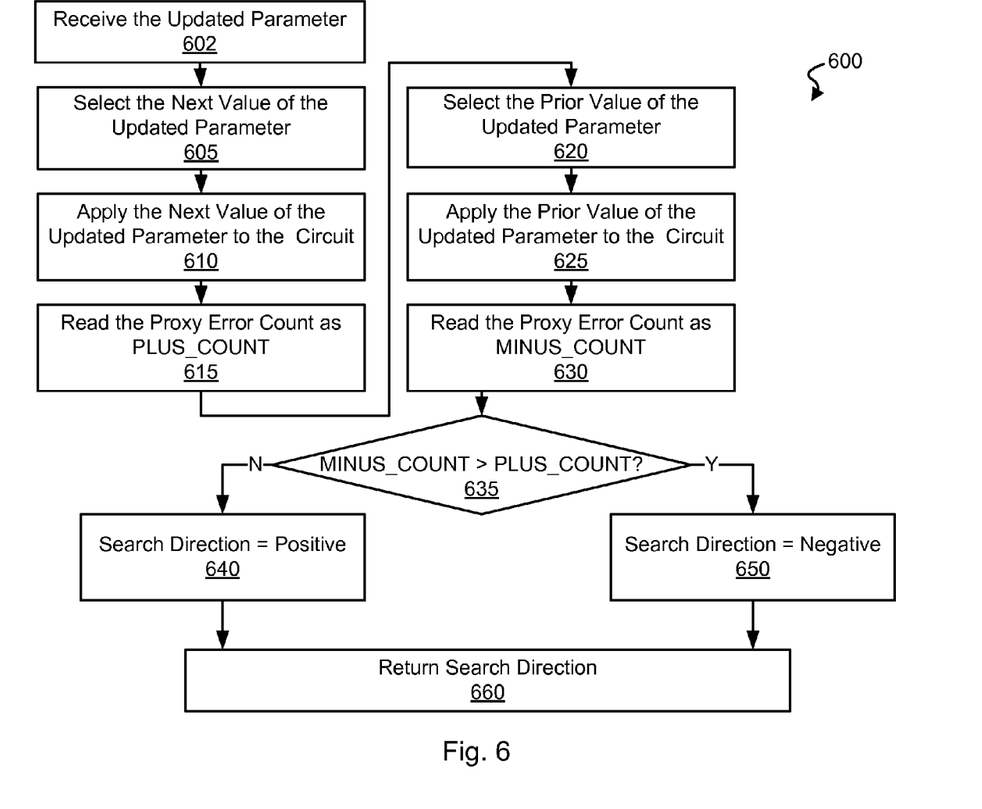

It is determined whether the value of NEXT_COUNT is less than or equal to the value of COUNT (block 550). Where the value of NEXT_COUNT is less than or equal to the value of COUNT (block 550), the variable COUNT is set equal to the value of NEXT_COUNT, and the value or PARAM is set equal to the value of the updated parameter (block 555). The process of blocks 530, 600, 535, 540, 545, 550, 555 repeats until all values for the selected parameter have been tested.

Once no values for the selected parameter have been tested (block 530) or where the value of NEXT_COUNT is not less than or equal to the value of COUNT (block 550), an acceptable value for the selected parameter has been stored in the variable PARAM and that value is applied to the data processing circuit (block 550). It is then determined whether another parameter of the data processing circuit remains to be tested (block 565). Where another parameter remains to be tested (block 565), the next parameter to be tested is selected (block 575) and the processes of blocks 510-565 (including block 600) are repeated for the newly selected parameter. Otherwise, where no other parameters remain to be tested (block 565), the testing process is ended (block 570).

Turning to FIG. 6, a flow diagram 600 shows a method in accordance with some embodiments of the present invention for determining a search direction. Flow diagram 600 outlines the method of the block from FIG. 5 of the same number. Following flow diagram 600, the updated parameter is received from the process of flow diagram 500 (block 602). The next value for the updated parameter (i.e., a value of the updated parameter increased by a defined amount) is selected (block 605). The next value of the updated parameter is applied to the data processing circuit (block 610). Applying the next value of the updated parameter to the processing circuit includes operating the processing circuit for a period with the updated parameter. As this processing is done, a count is made of how many instances of soft data from a data detector circuit is less than a defined threshold to yield a proxy error count. Once the processing is done, the proxy error count is read and stored as a variable PLUS_COUNT (block 520). The proxy error count value is then reset.

Then, the prior value of the updated parameter (i.e., a value of the updated parameter decreased by the defined amount) is selected (block 620). The prior value of the updated parameter is applied to the data processing circuit (block 625). Applying the prior value of the updated parameter to the processing circuit includes operating the processing circuit for a period with the updated parameter. As this processing is done, a count is made of how many instances of soft data from a data detector circuit is less than a defined threshold to yield a proxy error count. Once the processing is done, the proxy error count is read and stored as a variable MINUS_COUNT (block 630). The proxy error count value is then reset.

It is then determined whether the value of PLUS_COUNT is greater than the value of MINUS_COUNT (block 635). Where the value of PLUS_COUNT is greater than the value of MINUS_COUNT (block 635), the search direction is set equal to negative (block 650). Otherwise, the search direction is set equal to positive (block 640). The search direction is then returned for use in relation to the processes of FIG. 5 (block 660).

Figure 7:
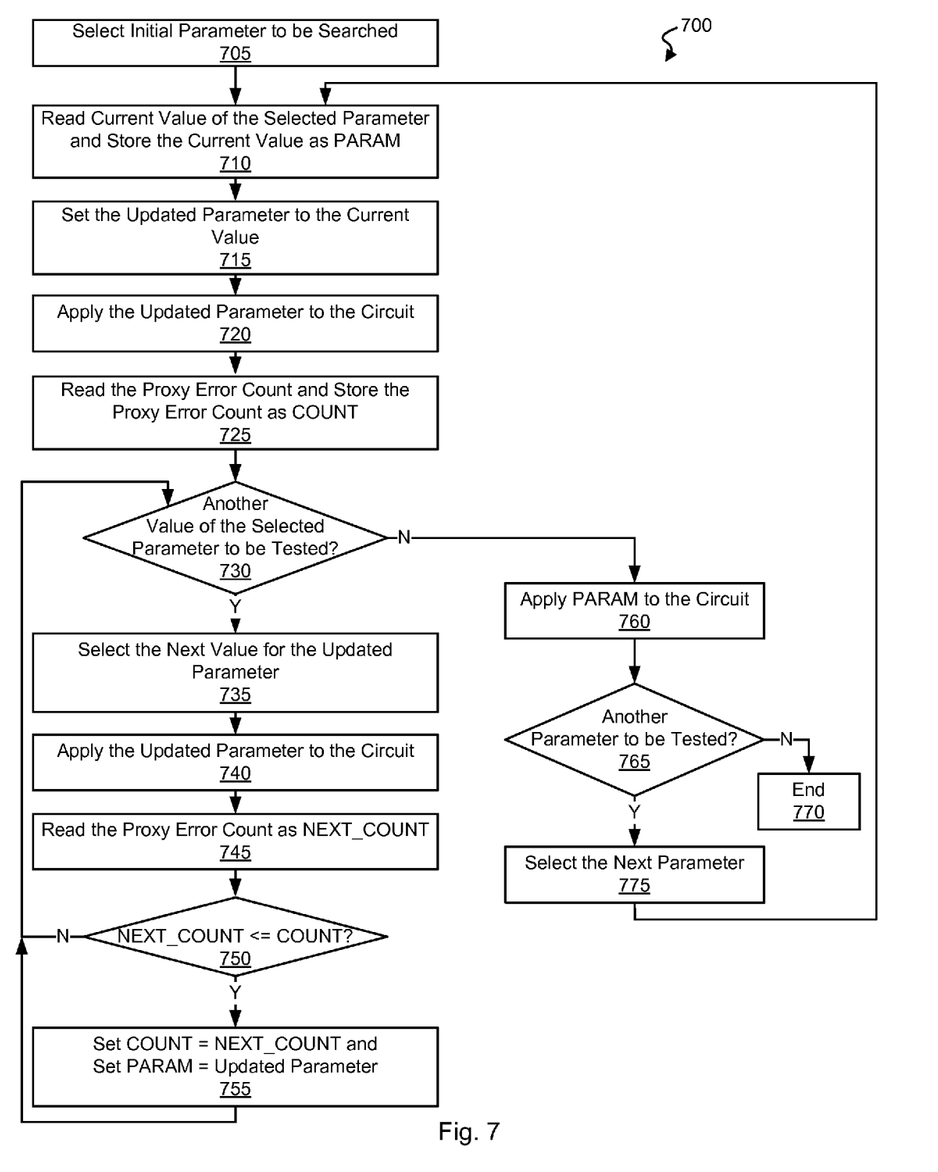
FIG. 7 is a flow diagram showing another method for reliability based parameter tuning in accordance with some embodiments of the present invention.

Turning to FIG. 7, a flow diagram 700 shows another method for reliability based parameter tuning in accordance with some embodiments of the present invention. Following flow diagram 700, an initial parameter is selected for search (block 705). The selected parameter may be any parameter governing operation of some part of a data processing circuit. As some examples, the parameter may be, but is not limited to, a gain of a variable gain amplifier, a cutoff frequency and/or boost of an analog filter, a DC loop offset, a target, a detector parameter used by a data detector circuit, and/or a decoder parameter used by a data decoder circuit. Based upon the disclosure provided herein, one of ordinary skill in the art will recognize a variety of parameters that may be adjusted by the methods of FIG. 7. A current value of the selected parameter is read and stored as a variable PARAM (block 710). An updated parameter (i.e., a parameter to be applied to the data processing circuit) is set equal to the current value (block 715) and the updated parameter is applied to the data processing circuit (block 720). Applying the updated parameter to the processing circuit includes operating the processing circuit for a period with the updated parameter. As this processing is done, a count is made of how many instances of soft data from a data detector circuit is less than a defined threshold to yield a proxy error count. Once the processing is done, the proxy error count is read and stored as a variable COUNT (block 725). The proxy error count value is then reset.

It is then determined whether another value of the selected parameter remains to be tested (block 730). Where another value remains to be tested (block 730), the next value for the updated parameter is selected (block 735). This newly updated parameter is then applied to the data processing circuit (block 740). Applying the updated parameter to the processing circuit includes operating the processing circuit for a period with the updated parameter. As this processing is done, a count is made of how many instances of soft data from a data detector circuit is less than a defined threshold to yield a proxy error count. Once the processing is done, the proxy error count is read and stored as a variable NEXT_COUNT (block 745). The proxy error count value is then reset.

It is determined whether the value of NEXT_COUNT is less than or equal to the value of COUNT (block 750). Where the value of NEXT_COUNT is less than or equal to the value of COUNT (block 750), the variable COUNT is set equal to the value of NEXT_COUNT, and the value or PARAM is set equal to the value of the updated parameter (block 755). The process of blocks 730-755 repeats until all values for the selected parameter have been tested.

Once all of the values for the selected parameter have been tested (block 730), the best available value for the selected parameter is stored in the variable PARAM and that value is applied to the data processing circuit (block 760). It is then determined whether another parameter of the data processing circuit remains to be tested (block 765). Where another parameter remains to be tested (block 765), the next parameter to be tested is selected (block 775) and the processes of blocks 710-765 are repeated for the newly selected parameter. Otherwise, where no other parameters remain to be tested (block 765), the testing process is ended (block 770).

Figure 8:
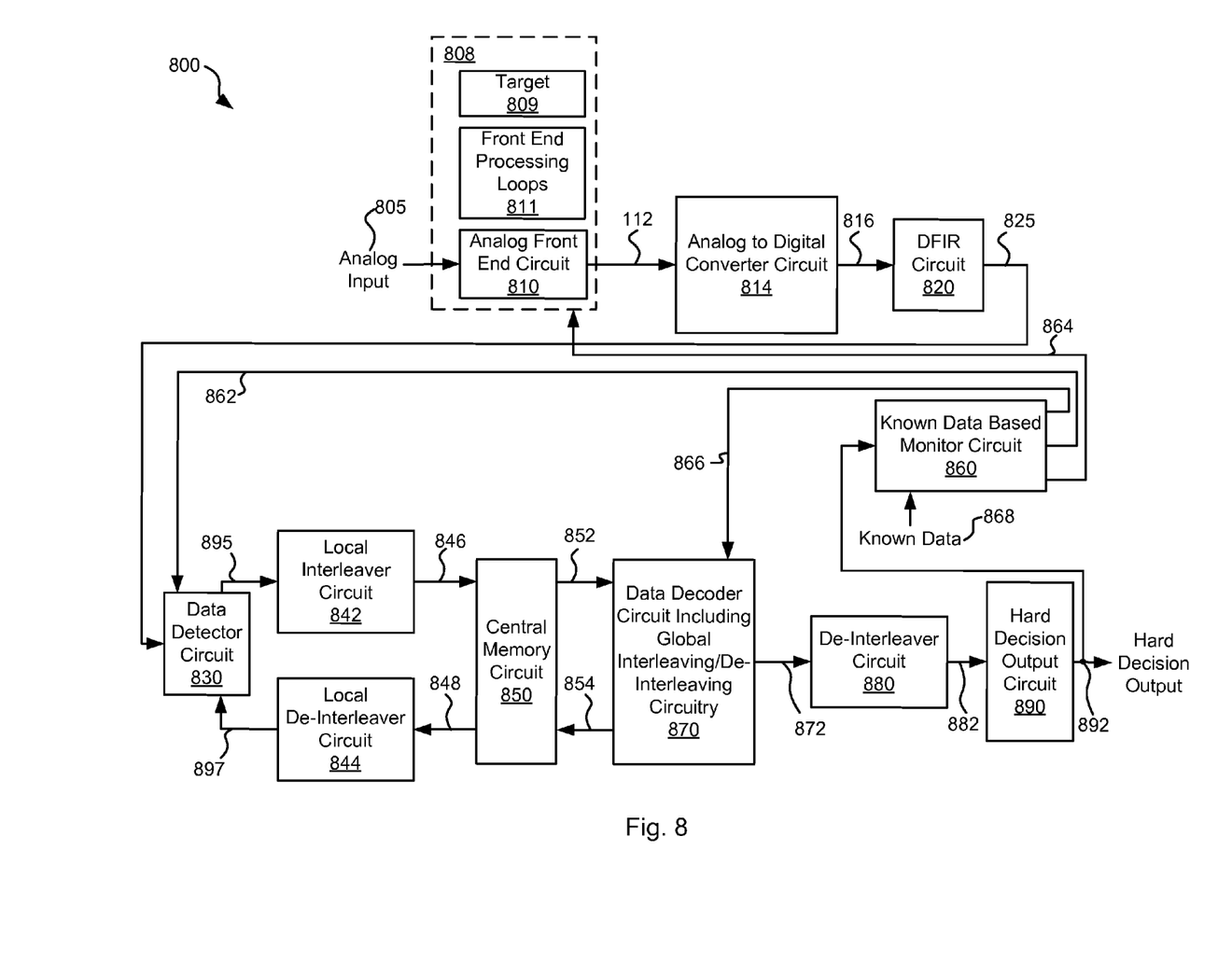
FIG. 8 shows a data processing circuit including known data based tuning circuitry with streamlined search in accordance with one or more embodiments of the present invention.

FIG. 8 shows a data processing circuit 800 including known data based monitor circuit 860 with streamlined search in accordance with one or more embodiments of the present invention. Data processing circuit 800 includes an analog processing circuit 808 that includes an analog front end circuit 810, front end processing loops 811 operable to provide timing and control to analog front end circuit 810, and a target circuit 809 operable to provide target based filtering feedback to analog front end circuit 810. Analog front end circuit 810 may include, but is not limited to, an analog filter and an amplifier circuit as are known in the art. Based upon the disclosure provided herein, one of ordinary skill in the art will recognize a variety of circuitry that may be included as part of analog front end circuit 810. In some cases, the gain of a variable gain amplifier included as part of analog front circuit 810 may be modifiable, and the cutoff frequency and boost of an analog filter included in analog front end circuit 810 may be modifiable. Front end processing loops 811 may be any processing loops operable to provide timing for analog front end circuit 810 known in the art. In some cases, such front end processing loops 811 include a DC loop offset that may be modifiable. Target circuit 809 may be any target based filter circuit known in the art. In various cases, a target used by target circuit 809 may be modifiable. Based upon the disclosure provided herein, one of ordinary skill in the art will recognize a variety of target based filter circuits and front end processing loops that may be used in relation to different embodiments of the present invention.

Analog front end circuit 810 that receives an analog signal 805. Analog front end circuit 810 processes analog signal 805 and provides a processed analog signal 812 to an analog to digital converter circuit 814. In some cases, analog signal 805 is derived from a read/write head assembly (not shown) that is disposed in relation to a storage medium (not shown). In other cases, analog signal 805 is derived from a receiver circuit (not shown) that is operable to receive a signal from a transmission medium (not shown). The transmission medium may be wired or wireless. Based upon the disclosure provided herein, one of ordinary skill in the art will recognize a variety of sources from which analog input 805 may be derived.

Analog to digital converter circuit 814 converts processed analog signal 812 into a corresponding series of digital samples 816. Analog to digital converter circuit 814 may be any circuit known in the art that is capable of producing digital samples corresponding to an analog input signal. Based upon the disclosure provided herein, one of ordinary skill in the art will recognize a variety of analog to digital converter circuits that may be used in relation to different embodiments of the present invention. Digital samples 816 are provided to an equalizer circuit 820. Equalizer circuit 820 applies an equalization algorithm to digital samples 816 to yield an equalized output 825. In some embodiments of the present invention, equalizer circuit 820 is a digital finite impulse response filter circuit as are known in the art. Equalized output 825 is provided to a data detector circuit 830. In some cases, equalizer 820 includes sufficient memory to maintain one or more codewords until a data detector circuit 830 is available for processing.

Data detector circuit 830 is operable to apply a data detection algorithm to a received codeword or data set, and in some cases data detector circuit 830 can process two or more codewords in parallel. In some embodiments of the present invention, data detector circuit 830 is a Viterbi algorithm data detector circuit as are known in the art. In other embodiments of the present invention, data detector circuit 830 is a maximum a posteriori data detector circuit as are known in the art. Based upon the disclosure provided herein, one of ordinary skill in the art will recognize a variety of data detector circuits that may be used in relation to different embodiments of the present invention. Data detector circuit 830 is started based upon availability of a data set from equalizer circuit 820 or from a central memory circuit 850.

Upon completion, data detector circuit 830 provides detector output 895. Detected output 895 is provided to a local interleaver circuit 842 and known data based monitor circuit 860. Local interleaver circuit 842 is operable to shuffle sub-portions (i.e., local chunks) of the data set included as detected output and provides an interleaved codeword 846 that is stored to central memory circuit 850. Interleaver circuit 842 may be any circuit known in the art that is capable of shuffling data sets to yield a re-arranged data set. Interleaved codeword 846 is stored to central memory circuit 850.

Once data decoder circuit 870 is available, a previously stored interleaved codeword 846 is accessed from central memory circuit 850 as a decoder input 852, globally interleaved as is known in the art, and a data decode algorithm is applied. In some embodiments of the present invention, the data decode algorithm is a low density parity check algorithm as are known in the art. Based upon the disclosure provided herein, one of ordinary skill in the art will recognize other decode algorithms that may be used in relation to different embodiments of the present invention. As the data decode algorithm completes on a given data set, it is determined whether the decode algorithm converged (i.e., the resulting data set matches the originally written data set as indicated by the lack of parity errors). Where it is determined that the decode algorithm converged, the resulting decoded data set is provided as a hard decision output 872 to a de-interleaver circuit 880. De-interleaver circuit 880 rearranges the data to reverse both the global and local interleaving applied to the data to yield a de-interleaved output 882. De-interleaved output 882 is provided to a hard decision output circuit 890. Hard decision output circuit 890 is operable to re-order data sets that may complete out of order back into their original order. The originally ordered data sets are then provided as a hard decision output 892.

Alternatively, where it is determined that the data decode algorithm failed to converge (i.e., there are remaining parity errors), the completed data set is globally de-interleaved as is known in the art and written back to central memory circuit 850 as a decoder output 854. Once data detector circuit 830 is available, a previously stored decoder output 848 is accessed from central memory circuit 850 and locally de-interleaved by a de-interleaver circuit 844. De-interleaver circuit 844 re-arranges decoder output 848 to reverse the shuffling originally performed by interleaver circuit 842. A resulting de-interleaved output 897 is provided to data detector circuit 830.

In some cases, known data based monitor circuit 860 operates only during a testing/tuning period. In other cases, known data based monitor circuit 860 is continuously operated. Known data based monitor circuit 860 receives detector output 895 and modifies one or more parameter used to govern the operation of data processing circuit 800. The parameters may be communicated to: analog processing circuit 808 via an input/output 864, data detector circuit 830 via an input output 862, and/or to data decoder circuit 870 via an input/output 866. The parameters may be, but are not limited to, a gain of a variable gain amplifier included in analog front end circuit 810, a cutoff frequency and/or boost of an analog filter included in analog front end circuit 810, a DC loop offset of front end processing loops 811, a target used by target circuit 809, a detector parameter used by data detector circuit 830, and/or a decoder parameter used by data decoder circuit 870. Based upon the disclosure provided herein, one of ordinary skill in the art will recognize a variety of parameters that may be adjusted by known data based monitor circuit 860 in accordance with different embodiments of the present invention.

Known data based monitor circuit 860 compares hard decision output 892 against a known data set 868. As data is being processed, known data based monitor circuit 860 selects a value(s) for one or more parameters provided to respective circuits via input/output 862, input/output 864, and input/output 866. Data is then processed through data processing circuit 800 using the selected parameter values over a period of time. Where known data based monitor circuit 860 determines that an instance of hard decision output 892 is not equal to a corresponding instance of known data set 868 an error is indicated. The error is incorporated into an error rate. Where the error rate exceeds a defined threshold, one or more new values for the one or more parameters are selected and the process of retesting continues until an acceptable parameter is identified. A circuit similar to that discussed above in relation to FIG. 2 may be used to implement known data based monitor circuit. The difference being that comparator 210 of the circuit of FIG. 2 receives known data set 868 and hard decision output 892 in place of soft data 203 and reliability threshold 205. Known data based monitor circuit 860 incorporates a streamlined parameter value search process as discussed above in relation to FIGS. 5-6.

It should be noted that the various blocks discussed in the above application may be implemented in integrated circuits along with other functionality. Such integrated circuits may include all of the functions of a given block, system or circuit, or only a subset of the block, system or circuit. Further, elements of the blocks, systems or circuits may be implemented across multiple integrated circuits. Such integrated circuits may be any type of integrated circuit known in the art including, but are not limited to, a monolithic integrated circuit, a flip chip integrated circuit, a multichip module integrated circuit, and/or a mixed signal integrated circuit. It should also be noted that various functions of the blocks, systems or circuits discussed herein may be implemented in either software or firmware. In some such cases, the entire system, block or circuit may be implemented using its software or firmware equivalent. In other cases, the one part of a given system, block or circuit may be implemented in software or firmware, while other parts are implemented in hardware.

In conclusion, the invention provides novel systems, devices, methods and arrangements for data processing. While detailed descriptions of one or more embodiments of the invention have been given above, various alternatives, modifications, and equivalents will be apparent to those skilled in the art without varying from the spirit of the invention. Therefore, the above description should not be taken as limiting the scope of the invention, which is defined by the appended claims.

What is claimed is:

1. A data processing system, the data processing system comprising:
   a data detector circuit operable to apply a data detection algorithm to a data set to yield a detected output, wherein the detected output includes soft data; and
   a reliability monitor circuit operable to determine a proxy error count based at least in part on the soft data, and to modify a parameter governing an operation of the data processing system based at least in part on the proxy error count.

2. The data processing system of claim 1, wherein the data detection algorithm is selected from a group consisting of: maximum a posteriori data detection algorithm and a Viterbi detection algorithm.

3. The data processing system of claim 1, the data processing system further comprising:
   a data decoder circuit operable to apply a data decode algorithm to a derivative of the detected output to yield a decoded output.

4. The data processing system of claim 3, wherein the data decode algorithm is a low density parity check algorithm.

5. The data processing system of claim 3, wherein the reliability monitor circuit comprises:
   a comparator circuit operable to compare instances of the soft data against a threshold value; and a counter circuit operable to increment when an instance of the soft data is less than the threshold value to yield the proxy error count.

6. The data processing system of claim 5, wherein the threshold value is programmable.

7. The data processing system of claim 5, wherein the reliability monitor circuit further comprises:
a parameter modification control circuit operable to:
select a first value for the parameter and to store a first instance of the proxy error count corresponding to the first value;
select a second value for the parameter and to store a second instance of the proxy error count corresponding to the second value; and
select one of the first value and the second value based at least in part on a comparison of the first instance of the proxy error count and the second instance of the proxy error count.

8. The data processing system of claim 7, wherein selecting the second value for the parameter comprises:
determining a search direction based at least in part on the first value; and
using the search value and a step size to calculate the second value.

9. The data processing system of claim 8, wherein the steps size is programmable.

10. The data processing system of claim 7, wherein:
selecting the first value for the parameter includes selecting one of a number of values to be searched; and
selecting the second value for the parameter includes selecting another of the number of values to be searched.

11. The data processing circuit of claim 1, wherein the data processing system is implemented as part of a device selected from a group consisting of: a storage device and a receiving device.

12. The data processing system of claim 1, wherein the data processing system is implemented as part of an integrated circuit.

13. A method for data processing, the method comprising:
performing a data detection algorithm using a data detector circuit on a data set to yield a detected output, wherein the detected output includes soft data;
comparing instances of the soft data against a threshold value;
modifying a proxy error count value based at least in part on the comparison of the instances of the soft data against the threshold value; and
selecting a parameter value based at least in part on the proxy error count, wherein the parameter value governs an operation of a data processing circuit.

14. The method of claim 13, wherein the detected output is a first detected output, wherein the soft data is a first soft data, wherein the parameter value is a first parameter value, wherein the proxy error count is a first proxy error count, wherein the data set is a first data set, and wherein the method further comprises:
performing a data detection algorithm on a second data set to yield a second detected output, wherein the second detected output includes a second soft data;
comparing instances of the second soft data against the threshold value;
modifying a second proxy error count value based at least in part on the comparison of the instances of the second soft data against the threshold value;
comparing the first proxy error count with the second proxy error count; and
wherein selecting the first parameter value is based on the comparison of the first proxy error count with the second proxy error count.

15. The method of claim 14, wherein the first parameter value is applied to the data processing circuit while the data detector circuit applies the data detection algorithm to the first data set, and wherein the second parameter value is applied to the data processing circuit while the data detector circuit applies the data detection algorithm to the second data set.

16. The method of claim 13, wherein the data detection algorithm is selected from a group consisting of: maximum a posteriori data detection algorithm and a Viterbi detection algorithm.

17. The method of claim 13, wherein the data set includes a pattern of data selected from a group consisting of: a known data pattern, and an unknown data pattern.

18. A storage device, the storage device comprising:
a storage medium;
a head assembly disposed in relation to the storage medium and operable to provide a sensed signal corresponding to information on the storage medium;
a read channel circuit including:
an analog to digital converter circuit operable to sample an analog signal derived from the sensed signal to yield a series of digital samples;
an equalizer circuit operable to equalize the digital samples to yield a data set;
a data detector circuit operable to apply a data detection algorithm to the data set to yield a detected output, wherein the detected output includes soft data; and
a reliability monitor circuit operable to determine a proxy error count based at least in part on the soft data, and to modify a parameter governing an operation of the read channel circuit based at least in part on the proxy error count.

19. The storage device of claim 18, wherein the read channel circuit further comprises:
a data decoder circuit operable to apply a data decode algorithm to a derivative of the detected output to yield a decoded output;
wherein the data detection algorithm is selected from a group consisting of: maximum a posteriori data detection algorithm and a Viterbi detection algorithm; and
wherein the data decode algorithm is a low density parity check algorithm.

20. The storage device of claim 18, wherein the reliability monitor circuit comprises:
a comparator circuit operable to compare instances of the soft data against a threshold value;
a counter circuit operable to increment when an instance of the soft data is less than the threshold value to yield the proxy error count; and
a parameter modification control circuit operable to:
select a first value for the parameter and to store a first instance of the proxy error count corresponding to the first value;
select a second value for the parameter and to store a second instance of the proxy error count corresponding to the first value; and
select one of the first value and the second value based at least in part on a comparison of the first instance of the proxy error count and the second instance of the proxy error count.

21. The storage device of claim 20, wherein selecting the second value for the parameter comprises:
determining a search direction based at least in part on the first value; and using the search value and a step size to calculate the second value.

22. The storage device of claim 20, wherein:
selecting the first value for the parameter includes selecting one of a number of values to be searched; and
selecting the second value for the parameter includes selecting another of the number of values to be searched.

* * * * *